United States Patent [19]

Van Oekel

[11] Patent Number: 4,814,293

[45] Date of Patent: Mar. 21, 1989

[54] METHOD OF MANUFACTURING A SEMICONDUCTOR DEVICE

[75] Inventor: Jacques J. Van Oekel, Eindhoven, Netherlands

[73] Assignee: U.S. Philips Corporation, New York, N.Y.

[21] Appl. No.: 191,299

[22] Filed: May 6, 1988

[30] Foreign Application Priority Data

May 18, 1987 [NL] Netherlands ............... 8701184

[51] Int. Cl.[4] ............ H01L 21/302; H01L 21/30; H01L 21/02
[52] U.S. Cl. ............................ 437/192; 437/245; 437/246; 156/634; 156/656; 156/664
[58] Field of Search .............. 437/192, 245, 246; 156/634, 656, 664

[56] References Cited

FOREIGN PATENT DOCUMENTS 138257 10/1980 Japan .
138255 10/1980 Japan .
138235 10/1980 Japan .
707949  1/1980 U.S.S.R. .

Primary Examiner—Brian E. Hearn
Assistant Examiner—B. Everhart
Attorney, Agent, or Firm—Paul R. Miller

[57] ABSTRACT

The invention relates to the manufacture of a semiconductor device, in which a titanium-tungsten layer (5) must be etched. In order to obtain a homogeneous course of the etching process, according to the invention, the etching is effected in a buffered hydrogen peroxide solution having a pH between 1 and 6.

20 Claims, 1 Drawing Sheet

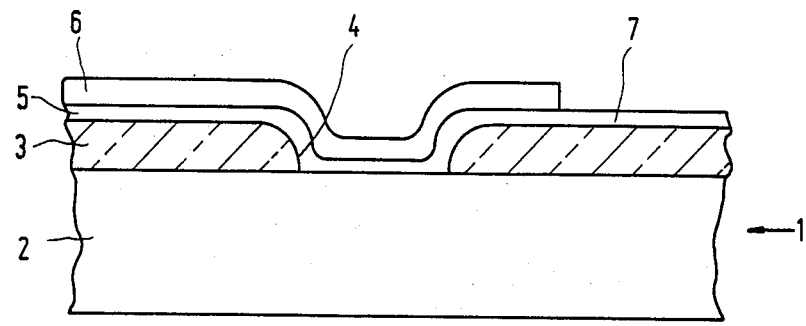

METHOD OF MANUFACTURING A SEMICONDUCTOR DEVICE

The invention relates to a method of manufacturing a semiconductor device, in which a titanium-tungsten layer is provided on a substrate, and a layer masking during etching of the titanium-tungsten layer is provided on this layer, whereupon the titanium-tungsten layer is etched in an etching solution of hydrogen peroxide in water.

A method of the kind mentioned in the opening paragraph is known from U.S. Pat. No. 4,267,012.

The use of hydrogen peroxide solutions as etchant for titanium-tungsten layers has the disadvantage that the etching process has an inhomogeneous course, as a result of which the disadvantage occurs that the extent of under-etching of the titanium-tungsten layer below the masking layer can be locally greatly different and no straight tracks of titanium-tungsten can be formed below a masking layer.

When the solution is agitated during etching, the inhomogeneity during etching even increases, as a result of which, in the known methods, movement in the liquid must be avoided.

The above patent discloses an etching solution for titanium-tungsten, which contains ammonia besides hydrogen peroxide. Such a solution etches too rapidly and has the disadvantage to be unstable, as a result of which the content of hydrogen peroxide rapidly decreases.

The invention has inter alia for its object to avoid the disadvantages described at least to a considerable extent.

According to the invention, the method mentioned in the opening paragraph is therefore characterized in that the pH of the etching solution is adjusted by means of a buffer to a value between 1 and 6.

The invention is based inter alia on the recognition of the fact that a favourable homogeneous etching result is obtained when the pH is kept as constant as possible during the etching treatment.

It has been found that the etching solution used in the method according to the invention is very stable.

Moreover, a wide choice is found to be possible with regard to buffers to be used.

It is important that during the etching treatment no undesired substances are left on a semiconductor body of the substrate. Therefore, ammonium is preferably used as the cation in the buffer. The acid used in the buffer is preferably an organic acid, preferably acetic acid or citric acid.

A very favourable buffer is composed of acetic acid and ammonium acetate.

Preferably, a concentration of 25 to 30% of hydrogen peroxide is used.

The masking layer for the titanium-tungsten layer consists preferably of aluminium or of photoresist. If aluminium is used, the aluminium layer is left on the titanium-tungsten layer after the etching treatment. The last-mentioned layer then serves, for example, as a diffusion barrier for the aluminium.

The titanium-tungsten layer may be provided directly on a semiconductor body, for example of silicon, of the substrate, but may also be provided, for example, on oxide present on a semiconductor body or moreover in the case of multilayer wiring on an aluminium layer already present on the substrate.

The invention will now be described with reference to a few embodiments and the accompanying drawing.

In the drawing, a part of a semiconductor body is shown diagrammatically and in sectional view at a stage of manufacture by means of the method according to the invention.

In a method of manufacturing a semiconductor device, a substrate 1 is formed, for example, by providing a semiconductor body 2 of silicon in a usual manner with a silicon oxide layer 3, in which openings 4 are formed.

For contacting the silicon body 2, a titanium-tungsten layer 5 is provided on the substrate 1 and an aluminium layer 6 masking during etching of the titanium-tungsten layer is provided on this layer.

The layers 5 and 6 are obtained in a usual manner by sputtering. A masking pattern desired in the layer 6 may be formed by plasma etching. The layer 5 serves as a diffusion barrier for aluminium from the layer 6 to the silicon body 2 in the opening 4 and as a mask against attack of the silicon body during plasma etching of aluminium. Parts 7 of the layer 5 exposed with respect to the layer 6 are etched in an etching solution of hydrogen peroxide in water.

A homogeneous etching of the layer 5 and also a homogeneous under-etching of the layer 5 under the layer 6 are obtained when the pH of the etching solution is adjusted by means of a buffer to a value between 1 and 6.

When the thickness of the layer 5 is, for example, 0.1 $\mu$m and the thickness of the layer 6 is 1 $\mu$m, the under-etching of the layer 5 under the layer 6 is homogeneously less than 0.1 $\mu$m.

The etching process can be carried out constantly at the ambient temperature.

EXAMPLE 1

An etching solution, in the case described of a titanium-tungsten layer 5 having a thickness of 0.1 $\mu$m obtained by sputtering (10% weight of Ti, 90% by weight of W) contains, for example 60.0 g of $CH_3COOH$ (100%)
77.0 g of $CH_3COONH_4$,
880 ml of $H_2O_2$ (30%).

The pH is 4.0 and the temperature during etching is 22° C. The layer 6 of aluminium containing 1 mol.% of silicon and having a thickness of 1.0 $\mu$m is also obtained by sputtering. The etching time of the parts 7 of the layer 5 is 11 minutes and is homogeneous, which also appears from a uniform under-etching of the layer 5 under the layer 6 of less than 0.1 $\mu$m.

EXAMPLE 2

In this case, the conditions are the same as in Example 1 with the difference that the concentration of hydrogen peroxide is reduced by half. The etching time is now 21 minutes.

EXAMPLE 3

The solution as described in Example 1 is reduced by means of nitric acid to a lower pH and is raised to a higher pH by means of sodium hydroxide, respectively. The results are the same as described in Example 1 on the understanding that the etching time depends in the following manner upon the pH:

| pH = 1 | etching time = 20 minutes, |

| | |
|---|---|
| pH = 3 | etching time = 14 minutes, |
| pH = 4 | etching time = 11 minutes, |
| pH = 5 | etching time = 9 minutes, |
| pH = 5.8 | etching time = 6.5 minutes. |

EXAMPLE 4

The conditions are the same as in Example 1 with the difference that instead of acetic acid and ammonium acetate 1 mole of citric acid is used, which is brought to a pH=4 by means of sodium hydroxide. The results are the same as those in Example 1 with the difference that the etching time is 30 minutes.

EXAMPLE 5

The conditions are the same as in Example 1 with the difference that instead of acetic acid and ammonium acetate 1 mole of ammonium dihydrogen phosphate is used, which is brought to a pH=4 by means of sodium hydroxide. The results are the same as those in Example 1 with the difference that the etching time is 23 minutes.

The invention is not limited to the examples described. For example, the layer 6 may consist of photoresist instead of of aluminium, analogous results being obtained.

Otherwise, it will be clear to those skilled in the art that in the invention described above variations and modifications other than those described specifically herein may be used without departing from the scope of the invention.

What is claimed is:

1. A method of manufacturing a semiconductor device, in which a titanium-tungsten layer is provided on a substrate and a layer masking during etching of the titanium-tungsten layer is provided on this layer, after which the titanium-tungsten layer is etched in an etching solution of hydrogen peroxide in water, characterized in that the pH of the etching solution is adjusted by means of a buffer to a value between 1 and 6.

2. A method as claimed in claim 1, characterized in that the cation used in the buffer is ammonium.

3. A method as claimed in claim 2, characterized in that the acid used in the buffer is preferably an organic acid.

4. A method as claimed in claim 3, characterized in that acetic acid or citric acid is used.

5. A method as claimed in claim 4, characterized in that a buffer of acetic acid and ammonium acetate is used.

6. A method as claimed in claim 5 characterized in that the concentration of hydrogen peroxide in the etching solution is 25 to 30%.

7. A method as claimed in claim 6, characterized in that an aluminium layer is used as the masking layer.

8. A method as claimed in claim 6, characterized in that a photoresist layer is used as the masking layer.

9. A method as claimed in claim 4, characterized in that the concentration of hydrogen peroxide in the etching solution is 25 to 30%.

10. A method as claimed in claim 3, characterized in that the concentration of hydrogen peroxide in the etching solution is 25 to 30%.

11. A method as claimed in claim 1, characterized in that the concentration of hydrogen peroxide in the etching solution is 25 to 30%.

12. A method as claimed in claim 3, characterized in that an aluminum layer is used as the masking layer.

13. A method as claimed in claim 11, characterized in that an aluminum layer is used as the masking layer.

14. A method as claimed in claim 1, characterized in that an aluminum layer is used as the masking layer.

15. A method as claimed in claim 3, characterized in that a photoresist layer is used as the masking layer.

16. A method as claimed in claim 11, characterized in that a photoresist layer is used as the masking layer.

17. A method as claimed in claim 1, characterized in that a photoresist layer is used as the masking layer.

18. A method as claimed in claim 1, characterized in that the acid used in the buffer is preferably an organic acid.

19. A method as claimed in claim 18, characterized in that acetic acid or citric acid is used.

20. A method as claimed in claim 18, characterized in that the concentration of hydrogen peroxide in the etching solution is 25 to 30%.

* * * * *